United States Patent
Zhang

(10) Patent No.: US 7,264,753 B2
(45) Date of Patent: *Sep. 4, 2007

(54) HIGH RESISTANCE POLY(3,4-ETHYLENEDIOXYTHIOPHENE)/POLY(STYRENE SULFONATE) FOR USE IN HIGH EFFICIENCY PIXELLATED POLYMER ELECTROLUMINESCENT DEVICES

(75) Inventor: Chi Zhang, Goleta, CA (US)

(73) Assignee: E. I. du Pont de Nemours and Company, Wilmington, DE (US)

(*) Notice: Subject to any disclaimer, the term of this patent is extended or adjusted under 35 U.S.C. 154(b) by 0 days.

This patent is subject to a terminal disclaimer.

(21) Appl. No.: 11/265,604

(22) Filed: Nov. 2, 2005

(65) Prior Publication Data

US 2006/0219982 A1 Oct. 5, 2006

Related U.S. Application Data

(62) Division of application No. 10/748,927, filed on Dec. 30, 2003, now Pat. No. 7,005,088.

(60) Provisional application No. 60/438,209, filed on Jan. 6, 2003.

(51) Int. Cl.
  *H01B 1/12* (2006.01)
  *C08J 7/04* (2006.01)
  *C09D 165/00* (2006.01)
  *H01L 51/30* (2006.01)

(52) U.S. Cl. .................. 252/500; 257/499; 428/917

(58) Field of Classification Search ............... 252/500; 428/917; 427/96, 400, 435; 257/37, 499; 362/612, 800

See application file for complete search history.

(56) References Cited

U.S. PATENT DOCUMENTS

| 4,552,927 A | 11/1985 | Warren |
| 4,959,430 A | 9/1990 | Jonas et al. |
| 5,247,190 A | 9/1993 | Friend et al. |
| 5,286,413 A | 2/1994 | Hannecart et al. |
| 5,300,575 A | 4/1994 | Jonas et al. |
| 5,317,169 A | 5/1994 | Nakano et al. |

(Continued)

FOREIGN PATENT DOCUMENTS

EP  0 866 110 A1  9/1998

(Continued)

OTHER PUBLICATIONS

J. Y. Kim et al., Enhancement of Electrical Conductivity of Poly(3,4-Ethylenedioxythiophene)/poly(4-Styrenesulfonate) by a Change of Solvents, Synthetic Metals, 2002, 311-316, vol. 126.

(Continued)

*Primary Examiner*—Mark Kopec
(74) *Attorney, Agent, or Firm*—John H. Lamming

(57) ABSTRACT

High resistance PEDT/PSS buffer layers are provided for use in electroluminescent devices such as, e.g., OLEDs. In accordance with another embodiment, there are provided OLEDs comprising high resistance PEDT/PSS buffer layers. In accordance with a further embodiment, methods have been developed for decreasing the conductivity of a PEDT/PSS layer cast from aqueous solution onto a substrate, by adding a cyclic ether co-solvent to the aqueous solution of PEDT/PSS prior to casting. In one embodiment, there are provided methods for decreasing the inherent conductivity of a PEDT/PSS layer cast onto a substrate so that this material can be used as an intermediate buffer layer in red, green, blue organic light emitting diodes (RGB OLEDs).

14 Claims, 7 Drawing Sheets

U.S. PATENT DOCUMENTS

| | | |
|---|---|---|
| 5,378,402 A | 1/1995 | Cross et al. |
| 5,705,888 A | 1/1998 | Staring et al. |
| 5,766,515 A | 6/1998 | Jonas et al. |
| 5,986,400 A | 11/1999 | Staring et al. |
| 5,994,496 A | 11/1999 | Van Haare et al. |
| 6,001,281 A | 12/1999 | Lessner et al. |
| 6,056,899 A | 5/2000 | Lessner et al. |
| 6,083,635 A | 7/2000 | Jonas et al. |
| 6,136,176 A | 10/2000 | Wheeler et al. |
| 6,136,372 A | 10/2000 | Lessner et al. |
| 6,203,727 B1 | 3/2001 | Babinec et al. |
| 2002/0061419 A1 | 5/2002 | Woo et al. |
| 2005/0245723 A1* | 11/2005 | Louwet et al. ............... 528/373 |

FOREIGN PATENT DOCUMENTS

| | | |
|---|---|---|
| EP | 1 003 179 A1 | 5/2000 |
| EP | 0 757 088 B1 | 6/2000 |
| EP | 1 010 733 A2 | 6/2000 |
| EP | 0 786 926 B1 | 8/2001 |
| EP | 0 765 106 B1 | 11/2002 |
| WO | WO98/01909 A1 | 1/1998 |
| WO | WO 01/13087 A2 | 2/2001 |
| WO | WO 01/29611 A1 | 4/2001 |
| WO | WO 01/46987 A2 | 6/2001 |
| WO | WO 01/47043 A1 | 6/2001 |
| WO | WO 01/47044 A2 | 6/2001 |
| WO | WO 01/47045 A1 | 6/2001 |

OTHER PUBLICATIONS

A. Elschner et al., High-Resistivity PEDT/PSS for Reduced Crosstalk in Passive Matrix OELS, Asia Display/IDS '01, 1427-1430.

A. J. Sharpe, Jr. et al., Improved Cationic Conductive Polymer, Coating Conference [Proceedings], pp. 83-87, 1981.

* cited by examiner

HIGH RESISTANCE POLY(3,4-ETHYLENEDIOXYTHIOPHENE)/POLY(STYRENE SULFONATE) FOR USE IN HIGH EFFICIENCY PIXELLATED POLYMER ELECTROLUMINESCENT DEVICES

FIELD OF THE INVENTION

The invention relates to the use of conductive polymers in the production of pixellated electroluminescent devices, such as, organic light emitting diodes.

BACKGROUND OF THE INVENTION

Conductive polymers originally attracted the attention of researchers over 20 years ago. The interest generated by these polymers compared to conventional conducting materials (e.g., metals) was largely due to factors such as light weight, flexibility, durability, and potential ease of processing. To date the most commercially successful conductive polymers are the polyanilines and polythiophenes, which are marketed under a variety of tradenames.

The recent development of electroluminescent (EL) devices for use in light emissive displays has resulted in a rekindled interest in conductive polymers. EL devices such as organic light emitting diodes (OLEDs) containing conductive polymers generally have the following configuration:

anode/buffer layer/EL polymer/cathode

The anode is typically any material that has the ability to inject holes into the otherwise filled π-band of the semiconducting, EL polymer, such as, for example, indium/tin oxide (ITO). The anode is optionally supported on a glass or plastic substrate. The EL polymer is typically a conjugated semiconducting polymer such as poly(paraphenylenevinylene) or polyfluorene. The cathode is typically any material, such as Ca or Ba, that has the ability to inject electrons into the otherwise empty π-band of the semiconducting, EL polymer.

The buffer layer is typically a conductive polymer and facilitates the injection of holes from the anode into the EL polymer layer. The buffer layer can also be called a hole-injection layer, a hole transport layer, or may be characterized as part of a bilayer anode. Typical conductive polymers employed as buffer layers are the emeraldine salt form of polyaniline (PANI) or a polymeric dioxythiophene doped with a sulfonic acid. The most widely used dioxythiophene is poly(3,4-ethylenedioxythiophene) doped with polystyrene sulfonic acid, abbreviated as PEDT/PSS. PEDT/PSS is available commercially from Bayer, as Baytron® P.

PEDT/PSS has emerged as a leading candidate for use as a buffer layer in EL devices such as red, green, blue organic light emitting diodes (RGB OLEDs). However, one factor which is inhibiting the widespread use of PEDT/PSS in RGB OLEDs is the inability to control conductivity of this material without sacrificing device performance. For example, in the manufacture of RGB OLEDs, a low conductivity layer of PEDT/PSS (relative to the inherent conductivity of about $1.2 \times 10^{-5}$ Siemens per centimeter (S/cm)) is desired in order to minimize crosstalk between pixels in the display. Indeed, attempts have been made to adjust the conductivity of PEDT/PSS by incorporation of various polymer additives in aqueous solutions of PEDT/PSS prior to casting onto a substrate. However, these additives may have a deleterious effect on OLED performance.

It is possible to increase the resistivity, by decreasing the film thickness. However, reducing the thickness of PEDT/PSS buffer layers in OLEDs is not a good option, since thinner films give lower manufacturing yield due to the formation of electrical shorts. To avoid shorts, it is necessary to use a relatively thick buffer layer with a thickness of about 200 nm.

While the buffer layer must have some electrical conductivity in order to facilitate charge transfer, the conductivity of PEDT/PSS buffer layers is generally higher than necessary. Accordingly, there is a need for high resistance PEDT/PSS buffer layers for use in electroluminescent devices.

SUMMARY OF THE INVENTION

In accordance with one embodiment of the invention, there are provided high resistance PEDT/PSS films. In accordance with another embodiment of the invention, there are provided high resistance PEDT/PSS buffer layers for use in electroluminescent devices such as, e.g., OLEDs. In accordance with yet another embodiment of the invention, there are provided electroluminescent devices comprising high resistance PEDT/PSS buffer layers.

In accordance with a further embodiment of the invention, there are provided methods for producing high resistance buffer layers for use in OLEDs, the method comprising adding an effective amount of at least one co-solvent comprising a cyclic ether to an aqueous solution of PEDT/PSS, and casting the solution onto a substrate.

In accordance with a still further embodiment of the invention, methods have been developed for decreasing the conductivity of a PEDT/PSS layer cast from aqueous solution onto a substrate, the methods comprising adding at least one cyclic ether co-solvent to the aqueous solution of PEDT/PSS prior to casting.

DETAILED DESCRIPTION OF THE INVENTION

Figure 1:
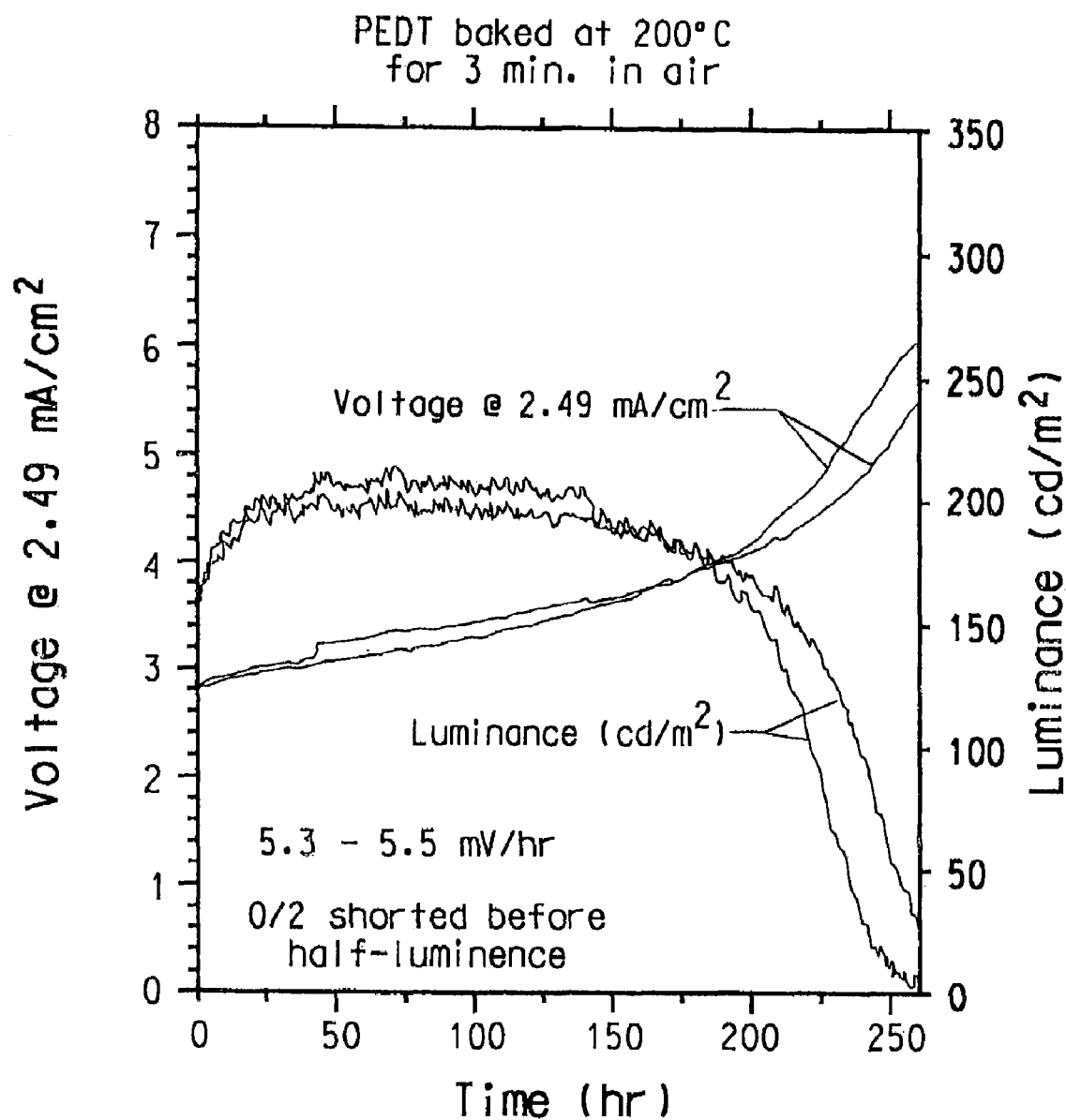
FIG. 1 illustrates the stress life at 80° C. of a device employing a buffer layer of PEDT/PSS (Baytron P CH8000, lot # CHN0004) cast from an aqueous solution containing no co-solvent.

In accordance with one embodiment of the invention, there are provided high resistance (low conductivity) PEDT/PSS films and buffer layers for use in electroluminescent devices such as, e.g., OLEDs. In accordance with another embodiment of the invention, there are provided OLEDs comprising high resistance (low conductivity) PEDT/PSS buffer layers.

Electrical resistivity is inversely proportional to electrical conductivity. Thus, as employed herein, the phrases "high resistance" and "low conductivity" are used interchangeably with reference to the PEDT/PSS buffer layers described herein. As used herein, the phrases "high resistance" and "low conductivity" each refer to a conductivity level less than that of commercially available PEDT/PSS, i.e., less than about $1.2 \times 10^{-5}$ S/cm.

Resistivity and conductivity values are typically reported in units of ohm-centimeter (ohm-cm) and Siemens per centimeter (S/cm), respectively. As used herein, conductivity values are reported (using the unit S/cm) rather than resistivity values.

In accordance with a further embodiment of the invention, there are provided methods for decreasing the conductivity of a PEDT/PSS layer cast from aqueous solution onto a substrate, the method comprising adding an effective amount of at least one cyclic ether co-solvent to the aqueous solution. In applications such as buffer layers in the manufacture of RGB OLEDs, a low conductivity PEDT/PSS layer is desired.

As used herein, the term "co-solvent" refers to a substance which is liquid at room temperature and is miscible with water. As used herein, the term "miscible" means that the co-solvent is capable of being mixed with water (at concentrations set forth herein for each particular co-solvent) to form a substantially homogeneous solution.

Exemplary cyclic ether co-solvents contemplated for use in the practice of the invention include 1,4-dioxane, tetrahydrofuran, tetrahydropyran, 4 methyl-1,3-dioxane, 4-phenyl-1,3-dioxane, 1,3-dioxolane, 2-methyl-1,3-dioxolane, 1,3-dioxane, 2,5-dimethoxytetrahydrofuran, 2,5-dimethoxy-2,5-dihydrofuran, and the like, as well as combinations of any two or more thereof. In one embodiment of the invention, the cyclic ether solvent is tetrahydrofuran, tetrahydropyran, or 1,4-dioxane. In another embodiment of the invention, the cyclic ether solvent is 1,4-dioxane.

The amount of co-solvent added to an aqueous solution of PEDT/PSS depends on the desired conductivity of the PEDT/PSS layer cast therefrom. The co-solvent is typically present in the aqueous solution at a concentration in the range of about 0.5 wt % up to about 70 wt % (wherein wt % refers to percent by weight of the total solution). In one embodiment, the co-solvent is present in the aqueous solution at a concentration in the range of about 0.5 wt % up to about 35 wt %. In another embodiment of the invention, the co-solvent is present in the aqueous solution at a concentration in the range of about 0.5 wt % up to about 10 wt %. In still another embodiment of the invention, the co-solvent is present in the aqueous solution at a concentration in the range of about 0.5 wt % up to about 2.5 wt %.

In one embodiment of the invention, addition of a cyclic ether solvent, such as, e.g., 1,4-dioxane, to an aqueous solution of PEDT/PSS results in a 100-fold decrease in conductivity of the PEDT/PSS layer cast therefrom (i.e., $10^{-5}$ S/cm for PEDT/PSS with no added co-solvent vs. $10^{-7}$ S/cm for PEDT/PSS with added 1,4-dioxane). PEDT/PSS layers prepared according to this embodiment of the invention are useful for passive pixellated displays, where low conductivity PEDT/PSS layers are desired to minimize crosstalk between pixels.

In another embodiment of the invention, there are provided methods for producing high resistance buffer layers in polymer light emitting displays, comprising adding an effective amount of at least one cyclic ether co-solvent to an aqueous solution of PEDT/PSS, and casting the solution onto a substrate. High resistance PEDT/PSS buffer layers prepared according to the invention provide excellent hole injection, minimize electrical shorts, enhance device lifetimes, and minimize inter-pixel current leakage (i.e., crosstalk).

PEDT/PSS layers prepared according to the invention may be cast onto a substrate using a variety of techniques well-known to those skilled in the art. Typical casting techniques include, for example, solution casting, drop casting, curtain casting, spin-coating, screen printing, inkjet printing and the like. Casting is typically carried out at room temperature, although casting may also be carried out at higher or lower temperatures as known in the art.

PEDT/PSS layers prepared according to the invention may be cast onto a variety of substrates. In one embodiment of the invention, the PEDT/PSS layer is cast onto a thin layer of anode material that is optionally on a substrate such as glass, plastic, ceramic, silicon, and the like. Anode materials contemplated for use in the practice of the invention include indium/tin oxide (ITO), mixed oxides of the Group 2 elements (i.e., Be, Mg, Ca, Sr, Ba, Ra), the Group 13 elements (i.e., B, Al, Ga, In, Tl), the Group 14 elements (C, Si, Ge, Sn, Pb), and the like. As used herein, the phrase "mixed oxide" refers to oxides having two or more different cations selected from the Group 2 elements. Alternatively, the anode may be an organic material, such as conductive polyaniline or poly(dioxythiophenes).

In still another embodiment of the invention, there are provided electroluminescent devices comprising an anode, a buffer layer, an electroluminescent material, and a cathode, wherein the buffer layer has a conductivity of less than about $1 \times 10^{-5}$ S/cm.

In a further embodiment of the invention, it has been discovered that drying conditions of PEDT/PSS layers cast onto a substrate may be greatly simplified. For example, PEDT/PSS layers prepared according to the invention can be dried at temperatures below 90° C. These milder drying temperatures (relative to typical drying temperatures of above 200° C.) are desirable for flexible LED applications. The higher temperatures can cause some degradation of the flexible substrate and/or the electroluminescent material.

In a still further embodiment of the invention, there are provided methods for increasing the thickness of a PEDT/PSS layer cast from aqueous solution onto a substrate, the method comprising adding an effective amount of at least one co-solvent to the aqueous solution. Generally, the conductivity will increase slightly with increasing buffer layer thickness. The yield of display will increase with increasing buffer layer thickness. The device performance will slightly decrease with increasing buffer layer thickness.

The invention will now be described in greater detail by reference to the following non-limiting examples.

EXAMPLES

Example 1

Effect of the Co-Solvent on Conductivity and Thickness of PEDT/PSS

The aqueous solutions of PEDT/PSS used in the following examples were purchased from Bayer under the tradename Baytron P CH8000 (Baytron P CH8000 typically contains approximately 0.14 wt % PEDT and approximately 2.6 wt % PSS). Glass substrates were prepared with patterned ITO electrodes. PEDT/PSS layers were spin-cast as films on top of the patterned substrates and thereafter, dried as described in Table 1. The resistance between ITO electrodes was measured using a high resistance electrometer. Thickness of the film was measured by using a Dec-Tac surface profiler (Alpha-Step 500 Surface Profiler, Tencor Instruments).

As shown in Table 1 below, by adding a cyclic ether co-solvent, the conductivity of PEDT/PSS layers can be decreased by more than a factor of 30, e.g., from $1.2 \times 10^{-5}$ S/cm to less than $4.0 \times 10^{-7}$ S/cm. In general, the addition of the cyclic ether co-solvent also results in an increase in thickness of the layer. As illustrated by the two entries with asterisks in Table 1, PEDT/PSS layers prepared according to the invention may be effectively dried at 50° C. for 30 minutes in vacuum oven.

TABLE 1

Conductivity of PEDT/PSS with co-solvent

| Co-Solvent [wt %] | Spin Rate [rpm] | Thickness [Å] | Drying Method | Conductivity [S/cm] |
|---|---|---|---|---|
| None | 1000 | 1245 | a | $1.2 \times 10^{-5}$ |
| +0.5% 1,4-Dioxane | 1000 | 1631 | a | $5.6 \times 10^{-6}$ |
| +1% 1,4-Dioxane | 1000 | 1818 | a | $1.8 \times 10^{-6}$ |
| +1% 1,4-Dioxane | 1000 | 2220 | a | $3.3 \times 10^{-6}$ |
| +1% 1,4-Dioxane * | 1000 | 1340 | b | $1.4 \times 10^{-6}$ |
| +1.5% 1,4-Dioxane * | 1000 | 1586 | b | $<5.9 \times 10^{-7}$ |
| +2% 1,4-Dioxane | 1000 | 1450 | a | $<6.2 \times 10^{-7}$ |
| +5% 1,4-Dioxane | 1000 | 1222 | a | $<7.7 \times 10^{-7}$ |
| +5% 1,4-Dioxane | 1000 | 2350 | a | $<4.0 \times 10^{-7}$ |
| +10% 1,4-Dioxane | 1000 | 1544 | a | $<6.1 \times 10^{-7}$ |
| +0.5% 1,4-Dioxane and 5% Isopropanol | 1000 | 2173 | a | $4.9 \times 10^{-6}$ |
| +0.5% 1,4-Dioxane and 5% Isopropanol | 1000 | 1240 | a | $4.3 \times 10^{-6}$ |
| +1% 1,4-Dioxane and 5% Isopropanol | 1000 | 1355 | a | $2.2 \times 10^{-6}$ |

(a) PEDT/PSS dried on a hot plate at 200° C. for 3 minutes in air
(b) PEDT/PSS dried at 50° C. for 30 minutes in vacuum oven.

Example 2

Figure 2:
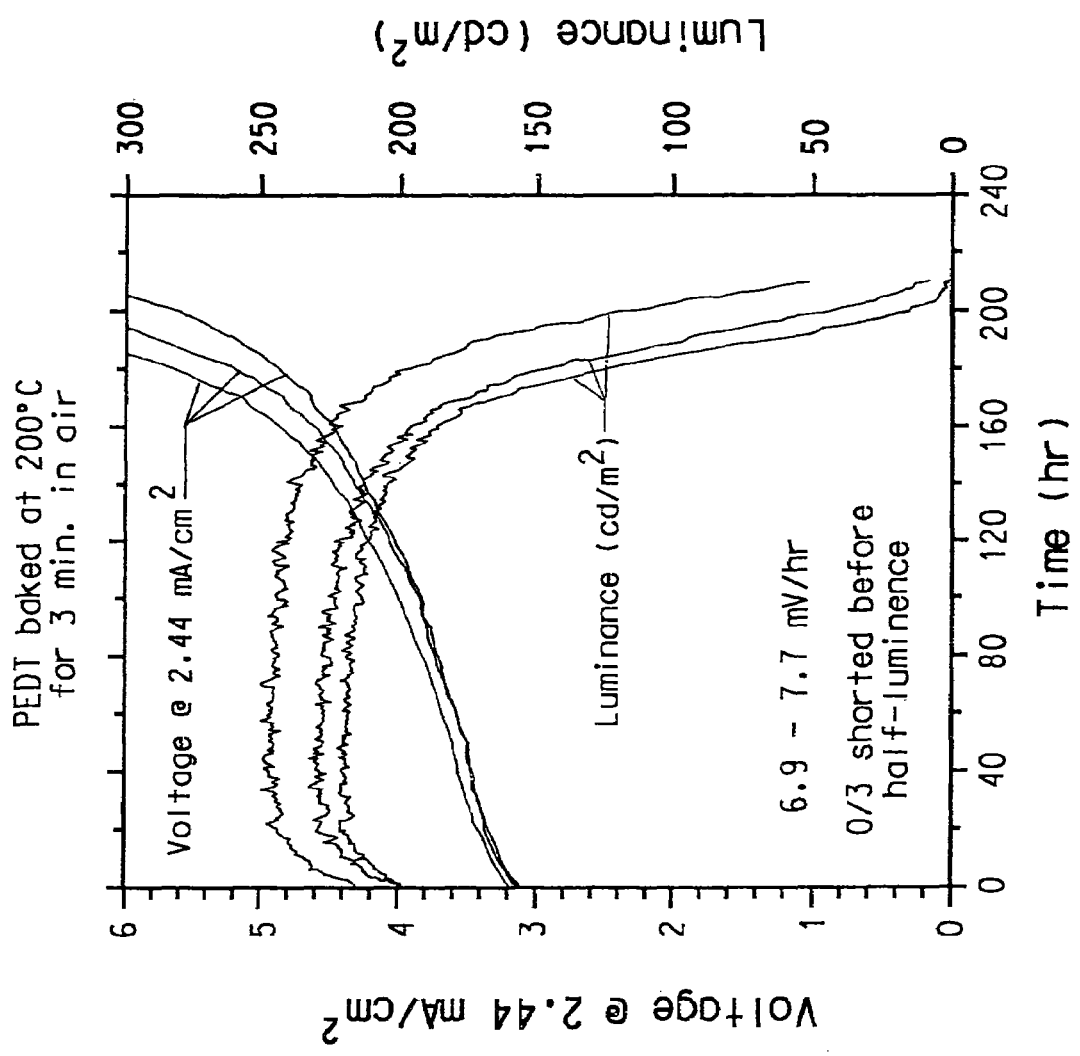
FIG. 2 illustrates the stress life at 80° C. of a device employing a layer of PEDT/PSS cast from an aqueous solution containing 1.5 wt % 1,4-dioxane, (i.e., Baytron P CH8000, lot # CHN0004 with 1.5 wt % 1,4-dioxane).

Effect on Stress Life of a Device Employing PEDT/PSS Layers Cast from an Aqueous Solution Containing Co-Solvent FIGS. 1 and 2 compare the stress life of electroluminescent (EL) devices having PEDT/PSS layers cast from aqueous solutions containing various co-solvents. The EL devices were made using as an electroluminescent material a soluble poly(1,4-phenylenevinylene) copolymer (C-PPV), as described by H. Becker et al., Adv. Mater. 12, 42 (2000). The devices had the configuration:

glass substrate—ITO anode—PEDT/PSS buffer layer—C-PPV Ba/Al cathode

FIG. 1 illustrates the stress life of a device employing PEDT/PSS without co-solvent. The buffer layer had a conductivity of $1.2 \times 10^{-5}$ S/cm. The buffer layer was cast at 1000 rpm and had a thickness of 129 nm. The electroluminescent layer was cast at 650 rpm and had a thickness of 74 nm. The stress life of the device was measured at 2.49 mA/cm$^2$ with 3 cm$^2$ backlight. The initial efficiency was 6.9-7.0 cd/A and the operating voltage was 3.7-3.8 V.

FIG. 2 illustrates the stress life of a device employing PEDT/PSS with 1.5% 1,4-dioxane. The buffer layer had a conductivity of less than $6.9 \times 10^{-8}$ S/cm. The buffer layer was cast at 1000 rpm and had a thickness of 136 nm. The electroluminescent layer was cast at 650 rpm and had a thickness of 76 nm. The stress life of the device was measured at 2.44 mA/cm$^2$ with 3 cm$^2$ backlight. The initial efficiency was 9.6-10.4 cd/A and the operating voltage was 3.6-3.9 V. The addition of the cyclic ether co-solvent decreased the conductivity of PEDT/PSS from $1.2 \times 10^{-5}$ S/cm to less than $6.9 \times 10^{-8}$ S/cm. The data in FIGS. 1 and 2 demonstrate that by adding at least one cyclic ether co-solvent to aqueous solutions of PEDT/PSS, the conductivity of PEDT/PSS layers cast therefrom can be controlled without compromising the stress life of the devices.

Example 3

Effect of Co-Solvent Concentration

Figure 3A:
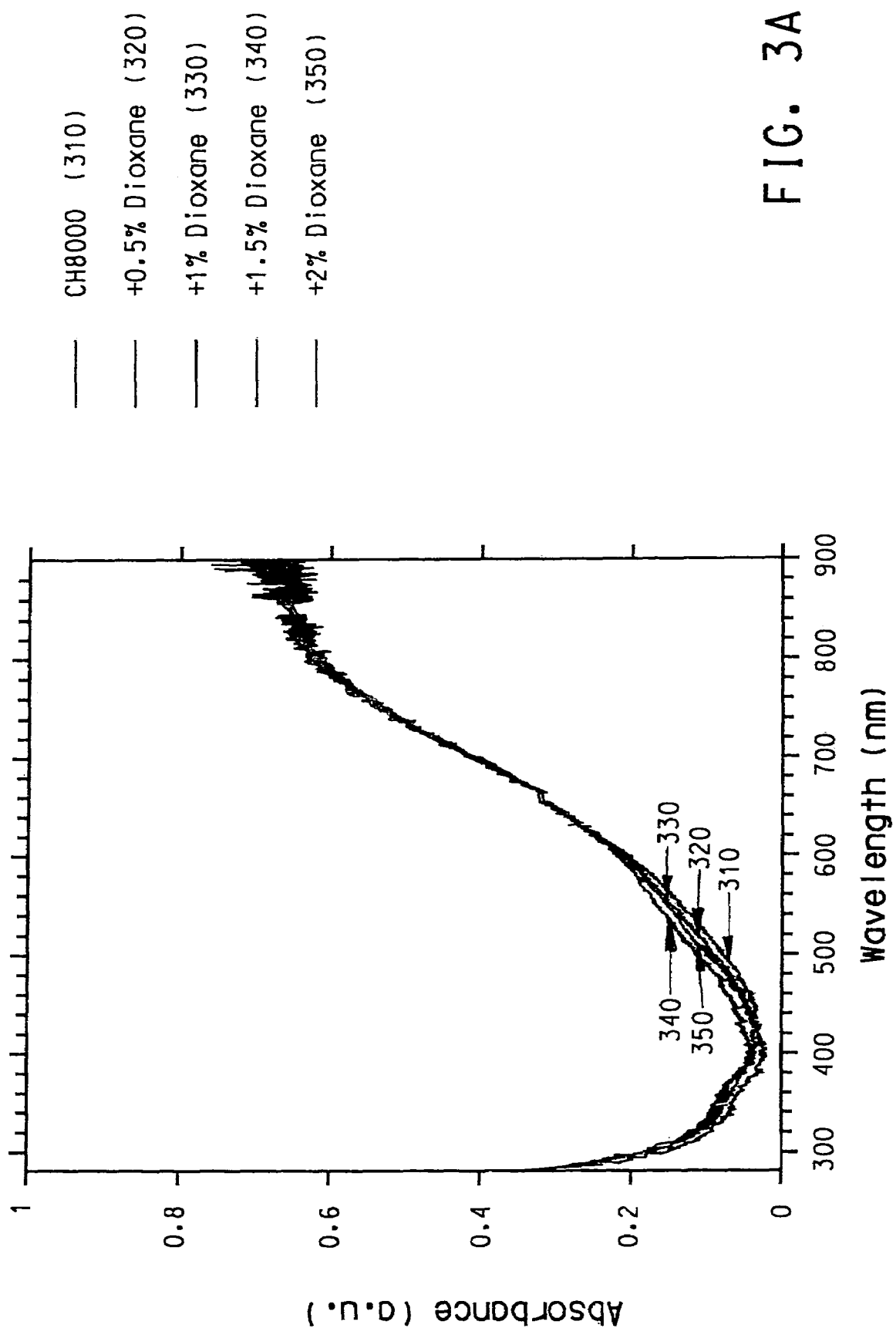
FIGS. 3A and 3B illustrate the absorption spectra of aqueous PEDT/PSS solutions (i.e., Baytron P CH8000, lot # CHN0004) containing various concentrations of 1,4-dioxane.
Figure 3B:
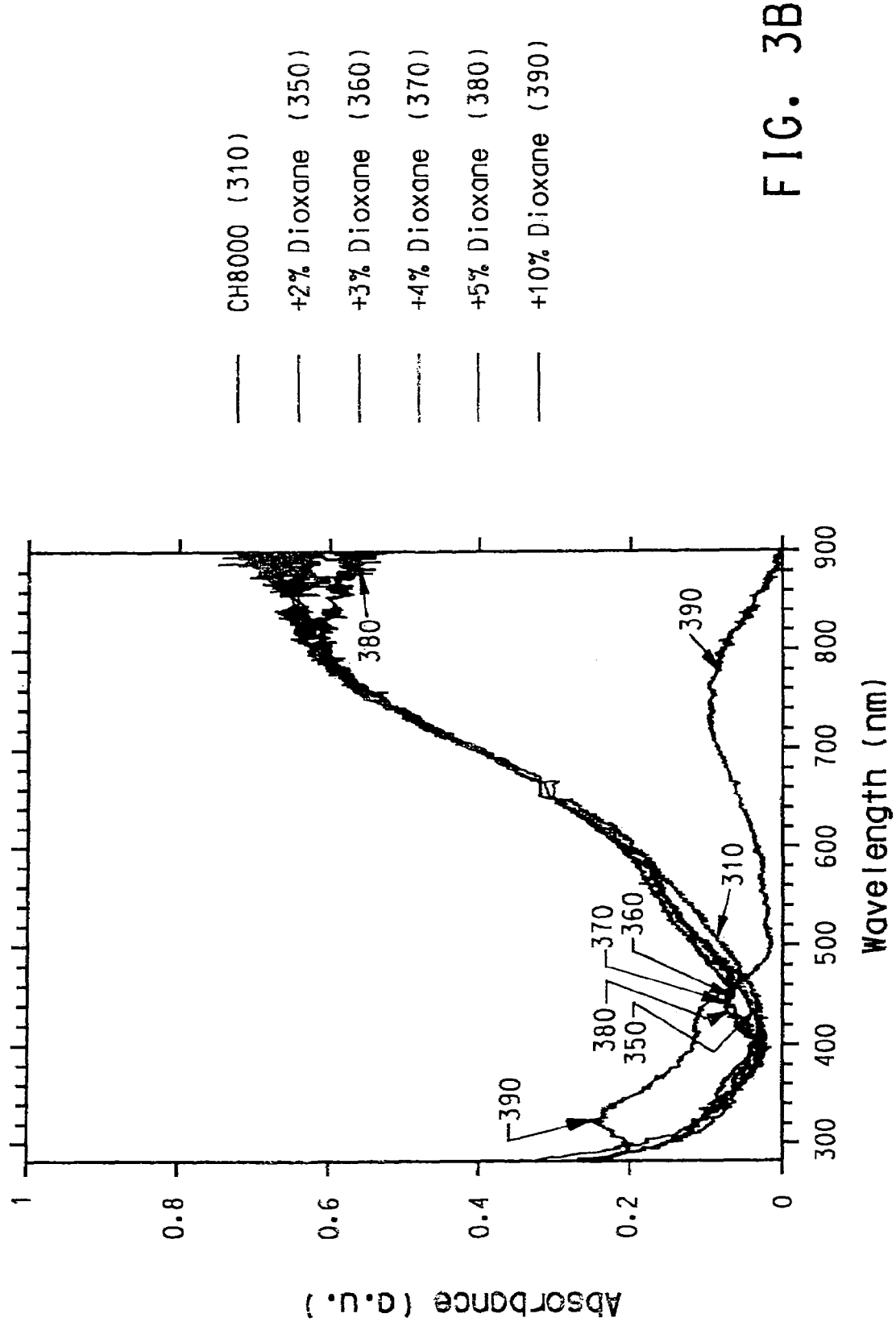

FIG. 3A and FIG. 3B show the absorption spectra of PEDT/PSS (Baytron P CH8000) solutions with various 1,4-dioxane concentrations. FIG. 3A illustrates the absorption spectra of PEDT/PSS without dioxane (310) and PEDT/PSS containing 0.5 wt % dioxane (320), 1.0 wt % dioxane (330), 1.5 wt % dioxane (340), and 2.0 wt % dioxane (350). As illustrated in FIG. 3A, the absorption spectra of PEDT/PSS containing less than or about 1,4-dioxane are essentially identical to that of PEDT/PSS alone when the 1,4-dioxane concentration is lower than 2 wt %. FIG. 3B illustrates the absorption spectra of PEDT/PSS wihout dioxane (310) and PEDT/PSS containing 2.0 wt % dioxane (350), 3.0 wt % dioxane (360), 4.0 wt % dioxane (370), 5.0 wt % dioxane (380), and 10.0 wt % dioxane (390). As illustrated in FIG. 3B, there is a dramatic change in the spectra of PEDT/PSS when the concentration of 1,4-dioxane is higher than 2 wt %. The peak around 920 nm is blue shifted to around 760 nm and two new peaks at 430 and 320 nm emerge. These changes are most clearly evident in FIG. 3B at a 1,4-dioxane concentration of 10 wt %.

Figure 4:
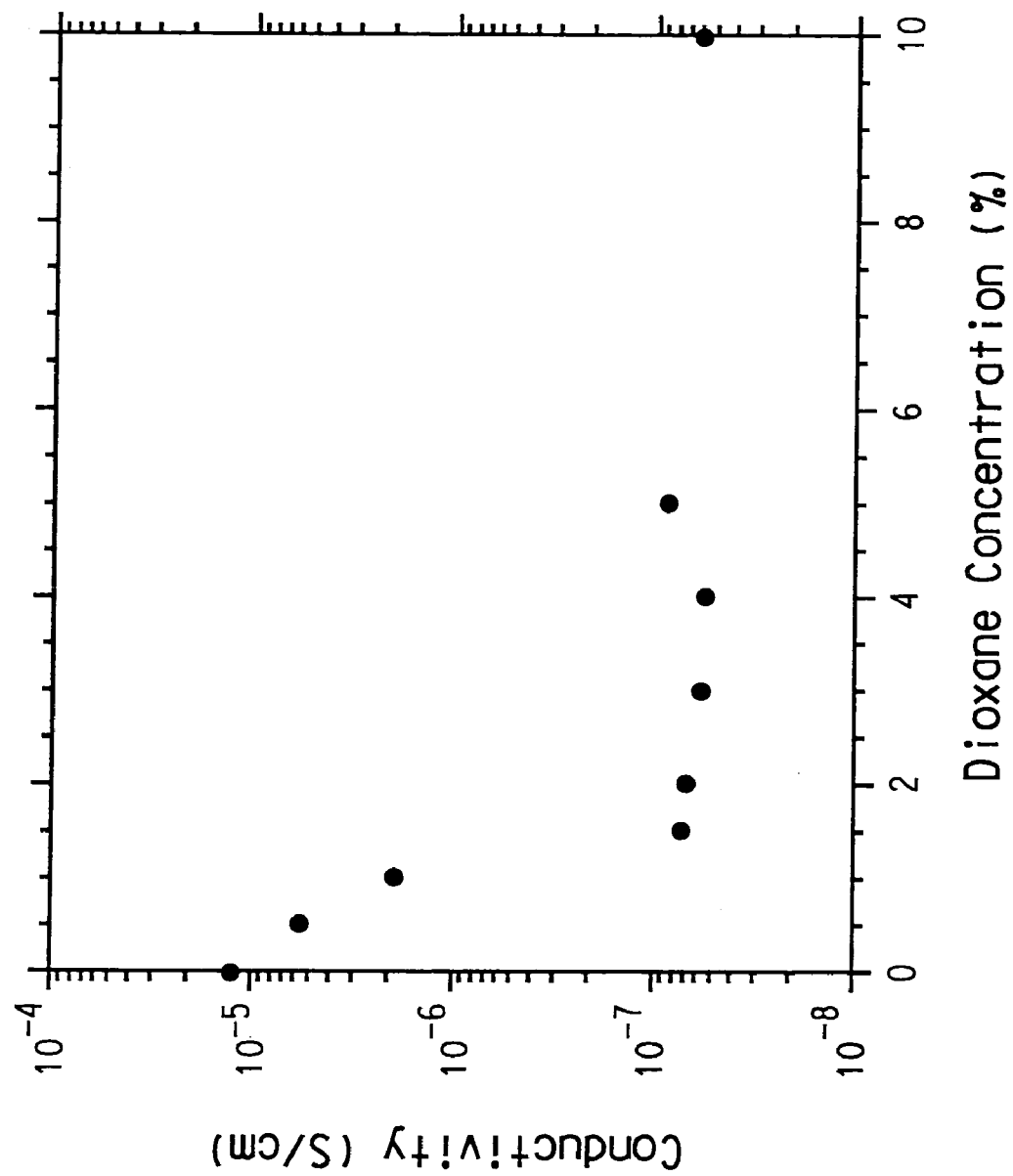
FIG. 4 illustrates the effect of 1,4-dioxane concentration on conductivity of PEDT/PSS layers cast from aqueous solution (i.e., Baytron P CH8000, lot # CHN0004) containing various amounts of 1,4-dioxane.
Figure 5:
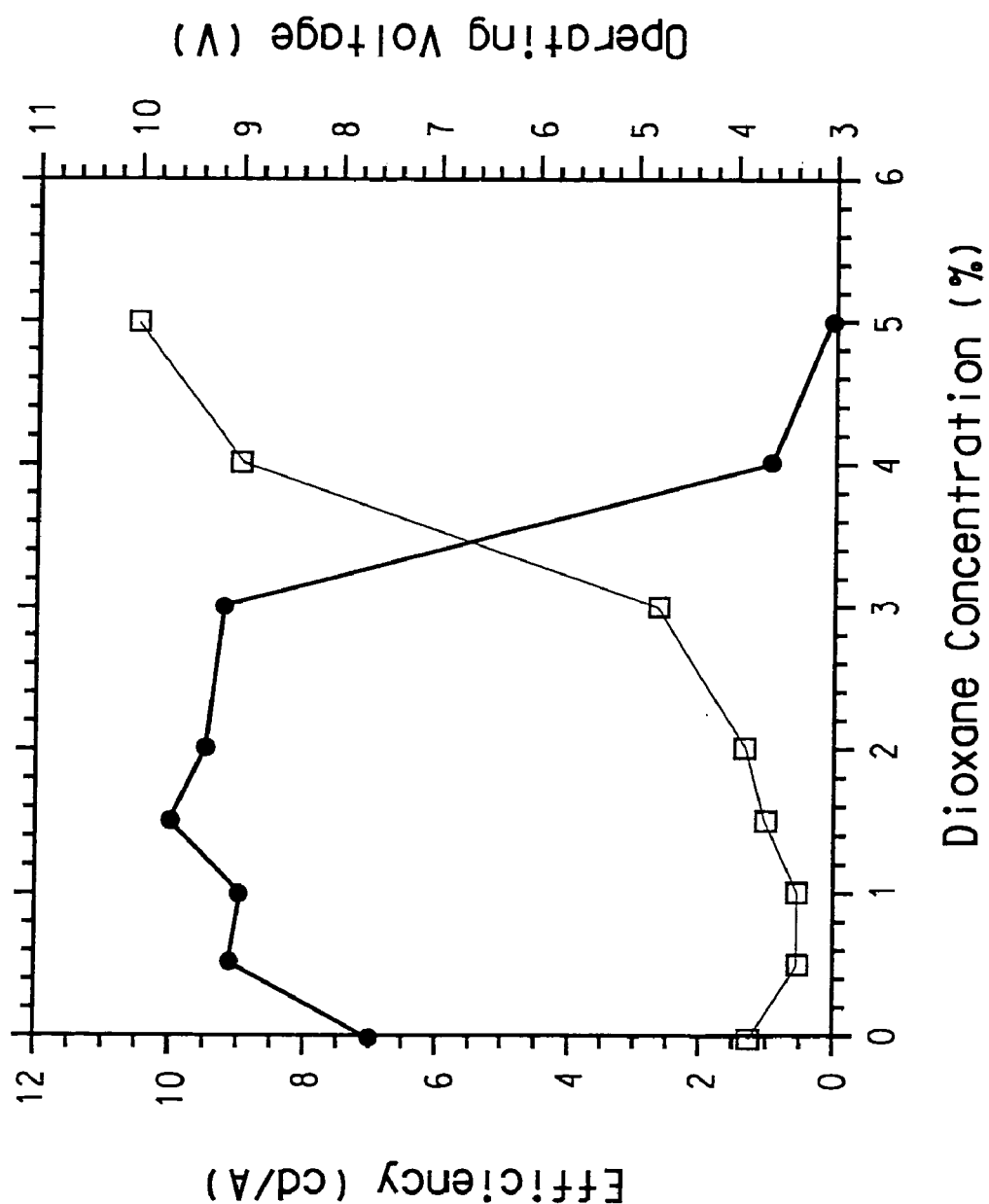
FIG. 5 illustrates the effect of 1,4-dioxane concentration on efficiency and operating voltage of SY device employing a PEDT/PSS layer cast from aqueous solutions (i.e., Baytron P CH8000, lot # CHN0004) containing various amounts of 1,4-dioxane.
Figure 6:
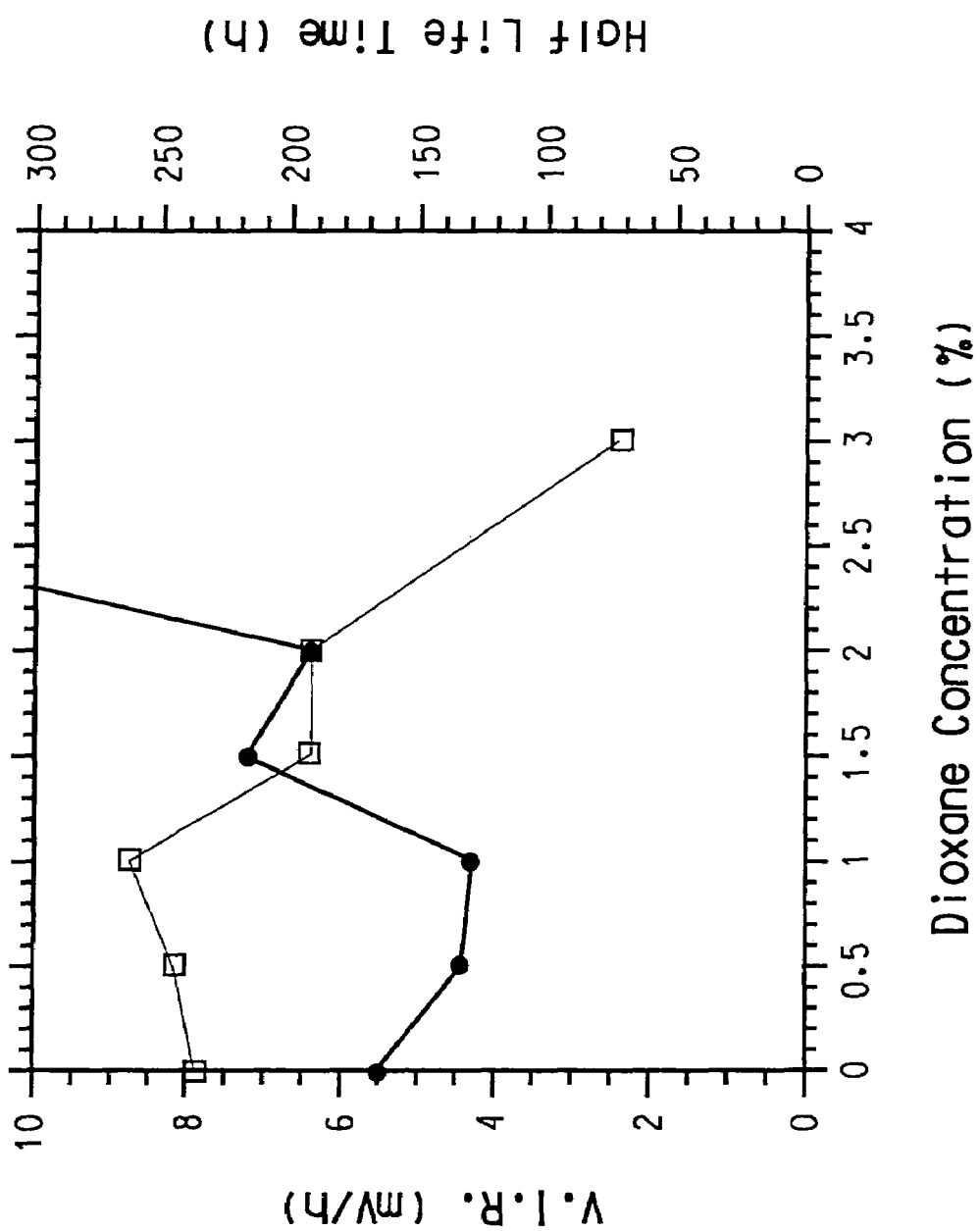
FIG. 6 illustrates the effect of 1,4-dioxane concentration on voltage increase rate (VIR) and stress life at 80° C. of a device employing a PEDT/PSS layer cast from aqueous solutions (i.e., Baytron P CH8000, lot # CHN0004) containing various amounts of 1,4-dioxane.

As shown in FIG. 4, the conductivity of PEDT/PSS films, prepared as described in Example 1, decreases sharply with increasing 1,4-dioxane concentration. The conductivity drops to less than $7 \times 10^{-7}$ S/cm (which approaches the detection limits of the instrument at a 1,4-dioxane concentration of 1.5%. As shown in FIG. 5, the efficiency of the EL device drops and the operating voltage increases when the 1,4-dioxane concentration is over 2 wt %). Referring to FIG. 6, a similar increase in voltage is observed (voltage increase rate, (V.I.R.)) while the stress life time at 80° C. decreases when the 1,4-dioxane concentration is over 2 wt %. The data in FIGS. 1-6 indicate that the preferred 1,4-dioxane concentration in aqueous solutions of PEDT/PSS is around 1.0-1.5 wt %.

These data clearly demonstrate that the addition of 1,4-dioxane to an aqueous solution of PEDT/PSS at a concentration of about 1.0-1.5 wt % decreases the conductivity of a PEDT/PSS layer cast therefrom to less than $7 \times 10^{-7}$ S/cm and increases the thickness of the layer without compromising performance and stress life of the devices.

While the invention has been described in detail with reference to certain preferred embodiments thereof, it will be understood that modifications and variations are within the spirit and scope of that which is described and claimed.

What is claimed is:

1. A method for decreasing the conductivity of a poly(3,4-ethylenedioxythiophene)/poly(styrenesulfonate) layer cast from aqueous solution onto a substrate to less than about $1.2 \times 10^{-5}$ S/cm, said method comprising adding an effective amount of at least one cyclic ether co-solvent to said aqueous solution, and subsequently processing said aqueous solution to form said layer.

2. A method according to claim 1, wherein said cyclic ether solvent comprises a solvent selected from 1,4-dioxane, tetrahydrofuran, tetrahydropyran, 4 methyl-1,3-dioxane, 4-phenyl-1,3-dioxane, 1,3-dioxolane, 2-methyl-1,3-dioxolane, 1,3-dioxane, 2,5-dimethoxytetrahydrofuran, 2,5-dimethoxy-2,5-dihydrofuran, and combinations of any two or more thereof.

3. A method according to claim 2, wherein said substrate is a polymeric film.

4. A method according to claim 1, wherein said cyclic ether solvent comprises a solvent selected from tetrahydrofuran, tetrahydropyran, and 1,4-dioxane.

5. A method according to claim 1, wherein said at least one co-solvent comprises in the range of about 0.5 wt % up to about 70 wt % of the aqueous solution.

6. A method according to claim 5, wherein said at least one co-solvent comprises in the range of about 0.5 wt % up to about 35 wt % of the aqueous solution.

7. A method according to claim 6, wherein said at least one co-solvent comprises in the range of about 0.5 wt % up to about 10 wt % of the aqueous solution.

8. A method according to claim 7, wherein said at least one co-solvent comprises in the range of about 0.5 wt % up to about 2.5 wt % of the aqueous solution.

9. A method according to claim 1, wherein said poly(3,4-ethylenedioxythiophene)/poly(styrenesulfonate) layer is cast onto said substrate by spin-coating, curtain casting, or screen printing.

10. A method according to claim 1, wherein said substrate is indium/tin oxide.

11. A method according to claim 1, wherein said substrate is a polymeric film.

12. A method for producing a high resistance buffer layer having a conductivity less than about $1.2 \times 10^{-5}$ S/cm for use in a light emitting diode, said method comprising adding an effective amount of at least one cyclic ether co-solvent to an aqueous solution of poly(3,4-ethylenedioxythiophene)/poly(styrenesulfonate), and casting said solution onto a substrate to form said high resistance buffer layer.

13. A high resistance buffer layer for use in a light emitting diode prepared according to the method of claim 12.

14. A method for increasing thickness of a high resistance poly(3,4-ethylenedioxythiophene)/poly(styrenesulfonate) buffer layer having a conductivity less than about $1.2 \times 10^{-5}$ S/cm cast from aqueous solution onto a substrate, said method comprising adding an effective amount of at least one cyclic ether co-solvent to said aqueous solution, and subsequently processing said aqueous solution to form said buffer layer.

* * * * *